(12) United States Patent
Chen et al.

(10) Patent No.: US 7,547,205 B2
(45) Date of Patent: Jun. 16, 2009

(54) MICROIMPRINT/NANOIMPRINT UNIFORM PRESSING APPARATUS

(75) Inventors: Shou-Ren Chen, Hsinchu (TW); Chuan-Feng Chen, Hsinchu (TW); Yu-Lun Ho, Hsinchu (TW); Jen-Hua Wu, Hsinchu (TW); Wei-Han Wang, Hsinchu (TW); Lai-Sheng Chen, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 234 days.

(21) Appl. No.: 11/175,341

(22) Filed: Jul. 7, 2005

(65) Prior Publication Data

US 2006/0246169 A1    Nov. 2, 2006

(30) Foreign Application Priority Data

Apr. 27, 2005    (TW) ............... 94113378 A

(51) Int. Cl.
*B29C 43/02*    (2006.01)
(52) U.S. Cl. .............. 425/174.4; 425/193; 425/384; 425/385
(58) Field of Classification Search .............. 425/385, 425/389, 405.1, 406, 408, 415, DIG. 19, 425/174.4; 100/211; 156/583.3
See application file for complete search history.

(56) References Cited

U.S. PATENT DOCUMENTS

| | | | | |
|---|---|---|---|---|
| 6,062,133 | A | * | 5/2000 | Blalock .............. 156/583.3 |
| 6,482,742 | B1 | * | 11/2002 | Chou .............. 425/385 |
| 6,994,541 | B2 | * | 2/2006 | Chung et al. .............. 425/385 |
| 7,070,406 | B2 | * | 7/2006 | Jeans .............. 425/174.4 |
| 7,195,734 | B2 | * | 3/2007 | Heidari .............. 425/419 |
| 7,204,686 | B2 | * | 4/2007 | Chung et al. .............. 425/385 |
| 2004/0219249 | A1 | | 11/2004 | Chung et al. |

FOREIGN PATENT DOCUMENTS

| | | |
|---|---|---|
| CN | 2612536 Y | 5/2003 |
| CN | 1409832 A | 4/2007 |
| JP | 02-215517 | 8/1990 |
| JP | 03-016704 | 1/1991 |
| JP | 05-077394 | 3/1993 |
| JP | 2003-77867 A | 3/2003 |
| JP | 2004-288804 | 10/2004 |
| JP | 2004-335808 | 11/2004 |
| JP | 2005-101201 | 4/2005 |

OTHER PUBLICATIONS

Puscasu et al., "Comparison of infrared frequency selective surfaces fabricated by direct-write electron-beam and bilayer nanoimprint lithographies," J. Vac. Sci. Technol. B, vol. 18, No. 6, Nov./Dec. 2000, pp. 3578-3581.

* cited by examiner

*Primary Examiner*—Yogendra Gupta
*Assistant Examiner*—Thu Khanh T Nguyen
(74) *Attorney, Agent, or Firm*—Birch, Stewart, Kolasch & Birch, LLP

(57) ABSTRACT

A microimprint/nanoimprint uniform pressing apparatus is used to provide uniform imprinting pressure to a molding material layer between a substrate and a mold. The uniform pressing apparatus includes a uniform pressing unit for being directly in contact with the mold or the substrate, so as to allow each point to have equal pressure during imprinting and utilize a simple structure to transmit uniform imprinting pressure.

14 Claims, 8 Drawing Sheets

MICROIMPRINT/NANOIMPRINT UNIFORM PRESSING APPARATUS

The present invention has been published for the purpose of research at NNT third international conference held from Dec. 1 to Dec. 3, 2004 at Vienna, Austria, and a document proving the fact is per copy herewith enclosed.

FIELD OF THE INVENTION

The present invention relates to uniform pressing apparatuses, and more particularly, to a microimprint/nanoimprint uniform pressing apparatus.

BACKGROUND OF THE INVENTION

In conventional semiconductor fabrication processes, an optical lithography technology is usually employed to perform a lithography technique for forming required traces on a chip or a substrate. However, the optical lithography technology is subject to limitation on light diffraction and hardly applied to the case of having a line width smaller than 100 nanometers, thereby confining the development of line width. A next-generation lithography technology has been proposed, however it requires high device costs but has low yields. Therefore, a nanoimprint lithography (NIL) technology has been developed in recent years and widely used in lithographic processing, which can resolve the limitation on line width and has advantages such as high lithographic resolution, high fabrication rate and low production costs.

Generally, hot pressing molding process and ultraviolet curing molding process are the most prevalent nanoimprint techniques. The hot pressing molding process is to imprint patterns on a mold to a substrate coated with for example a polymer material under conditions of high temperature and high pressure. The ultraviolet curing molding process uses ultraviolet irradiation to cure and mold microstructures under conditions of normal temperature and normal pressure. These two processes both require uniform imprinting pressure to achieve satisfactory imprinting quality.

Referring to FIG. 6A, if the imprinting pressure is not uniformly applied, imprint depths of nanostructures 23 exerted by a mold 21 would be uneven, thereby causing partial distortion/deformation of the nanostructures 23. Referring to FIG. 6B, when the mold 21 is not perfectly parallel to a substrate 25, the nanostructures 23 in an imprint region are slanted, making the imprinting quality deteriorated. In the use of the hot pressing molding process, referring to FIG. 7A, a mold 21 fixed to an upper carrier 20 and having nanostructures 23 is employed during imprinting. The mold 21 is connected to a driving unit 50 driven by a power source and is moved toward a substrate 25 fixed to a lower carrier 30. However, this conventional pressing structure requires many mechanical components being stacked and assembled together. As the mechanical components are rigid, completely seamless contact between the mold, substrate, upper carrier and lower carrier cannot be achieved. Thus, the imprinting results as shown in FIG. 7B indicate quite uneven distribution of pressure. Such power transfer structure is difficult to satisfy the requirement of applying uniform pressure and causes unsatisfactory molding quality.

In view of the above problem of uneven pressure being applied, Puscasu et al. have proposed a reference entitled "Comparison of infrared frequency selective surfaces fabricated by direct-write electron-beam and bilayer nanoimprint lithographies" in November/December, 2000. Referring to FIG. 8, an upper plastic pad 27 is placed between an upper carrier 20 and a mold 21, and a lower plastic pad 29 is placed between a lower carrier 30 and a substrate 25. The plastic pads 27, 29 are softened when heating to a predetermined imprinting temperature, such that the plastic pads 27, 29 may provide relatively closer contact between the upper carrier 20 and the mold 21 and between the lower carrier 30 and the substrate 25 and uniform pressure can be applied during an imprinting process.

Since the above technology has nanoscale precision, quality of the imprinting process thereof must be more strictly controlled than that of the normal hot pressing molding process. However, the plastic pads under heating and pressure may encounter significant flowing deformation, thereby affecting transfer of imprinting force.

JP 2003-077867 discloses an imprint molding displacement mechanism. As shown in FIG. 9, the displacement mechanism uses a fulcrum 12 to give support to allow a substrate 25 to freely move on the fulcrum 12, and uses two spring elements 14 to carry two ends of the substrate 25. When a mold 21 is in contact with the substrate 25, the substrate 25 would automatically adjust its parallelism with respect to the mold 21 so as to achieve a function of applying uniform pressure. However, an imprinting device with this mechanism is only suitable for small area imprinting and has low yields; for large area imprinting, it would easily lead to substrate deformation especially at positions of the substrate relatively farther from the fulcrum. Further in the case of having excessive area for imprinting, the position of the substrate supported by the single fulcrum would be damaged due to stress concentration, making the function of applying uniform pressure hard to be conducted. Therefore, this conventional technology is still limited by size of imprinting area and magnitude of imprinting force though having the function of applying uniform pressure.

U.S. Patent Publication No. 20040219249 A1 discloses a nanoimprint uniform pressing apparatus. As shown in FIG. 10, the uniform pressing apparatus uses a uniform pressing unit 40 including a sealing membrane 40a made of a flexible material and a fluid 40b filled in a space formed by the sealing membrane 40a. The fluid 40b in the sealing membrane 40a has a property of each point with equal pressure so as to achieve effects of transferring uniform force and applying uniform pressure.

Although this apparatus does not encounter the problems in the foregoing conventional technology such as uneven pressure being applied, partial distortion/deformation of nanostructures, limited yields and stress concentration, the apparatus needs specific components for molding clamping, heating and cooling, and the uniform pressing unit 40 is not directly mounted on a mold or a substrate, such that a combination of components such as housing, heating/cooling unit and carrier unit must be used to transmit force to a molding region. As a result, transmission of uniform force would be affected by surface mechanical properties of the components (for example, surface roughness, parallelism, and mechanical processing accuracy).

In other words, the mechanical errors between different components must be precisely controlled to maintain satisfactory parallel arrangement between the mold and the substrate. This not only complicates the fabrication processes but also requires high assembly precision. Further as the uniform pressing unit 40 of the above apparatus is not directly mounted on the mold or substrate but is carried by a plurality of components, this causes difficulty in fabrication and assembly, and also makes the apparatus structure more complicated, thereby increasing the fabrication costs.

Therefore, in response to the various problems caused by uneven imprinting pressure and unsatisfactory parallelism during an imprinting process in the foregoing conventional technology and the difficulty in fabrication and assembly, it is greatly desirable to develop a uniform pressing apparatus, which can make each point in an imprint region have equal pressure, maintain satisfactory parallel arrangement between a mold and a substrate, and minimize influence of surface mechanical properties of other components on the parallel arrangement, so as to provide transmission of uniform imprinting pressure.

SUMMARY OF THE INVENTION

In light of the foregoing drawbacks in the conventional technology, an objective of the present invention is to provide a microimprint/nanoimprint uniform pressing apparatus, which has a simple structure to transfer uniform imprinting pressure.

Another objective of the present invention is to provide a microimprint/nanoimprint uniform pressing apparatus, which can reduce the apparatus costs.

Still another objective of the present invention is to provide a microimprint/nanoimprint uniform pressing apparatus, which can accomplish large area imprinting in one time to improve production yields.

A further objective of the present invention is to provide a microimprint/nanoimprint uniform pressing apparatus, which can be used in different imprint molding processes to increase industrial practicability.

In order to achieve the above and other objectives, the present invention proposes a microimprint/nanoimprint uniform pressing apparatus. In a preferred embodiment, the microimprint/nanoimprint uniform pressing apparatus is used to provide uniform imprinting pressure to a molding material layer between a substrate and a mold, and comprises: a uniform pressing unit for being directly in contact with the substrate or the mold; a holding unit adjacent to the uniform pressing unit; and a carrier unit for providing support for performing imprint molding.

Preferably, the holding unit is located above or below the mold. The holding unit is formed with an opening at one end thereof and an accommodating space for receiving the uniform pressing unit therein. In another preferred embodiment, the holding unit has openings at both ends thereof, wherein the mold is mounted at one of the openings of the holding unit and a pressing plate is mounted at the other opening of the holding unit to form an accommodating space for receiving the uniform pressing unit therein. The pressing plate can be connected to a driving unit. When the driving unit is driven by a power source to move downwardly, the holding unit and the uniform pressing unit are also moved downwardly until the mold is completely in contact with a single substrate or continuous substrates and establishes appropriate pressure, such that the uniform pressing unit received in the holding unit can directly apply pressure to the mold.

Preferably, the uniform pressing unit includes a flexible membrane and a fluid filled in a space formed by the flexible membrane. The flexible membrane is made of a sealed material capable of sustaining high pressure. The flexible membrane is selectively formed with a joint portion on an outer surface thereof, wherein the joint portion can be an attachment structure, a contact structure or a metallic fastener.

The carrier unit is used to carry the substrate. Two transmission units are provided at two sides of the carrier unit respectively to drive the substrate to undergo a continuous imprint molding process. The transmission unit is preferably a roller. Perfectly, the carrier unit is for example a power transfer unit having at least one power source therein, so as to transfer power to the molding material layer to perform an imprint molding process on the molding material layer.

In another preferred embodiment, the microimprint/nanoimprint uniform pressing apparatus in the present invention is mounted to a pressing plate connected to a driving unit, to provide uniform imprinting pressure to a molding material layer between a substrate and a mold. The uniform pressing apparatus comprises: a flexible membrane connected to the pressing plate and for being directly in contact with the mold or the substrate; a fluid filled in a space formed by the flexible membrane; and a carrier unit for providing support for performing imprint molding.

The flexible membrane is made of a sealed material capable of sustaining high pressure. The carrier unit carries the substrate, wherein the carrier unit is a power transfer unit having at least one power source therein, so as to transfer power to the molding material layer to perform an imprint molding process on the molding material layer.

Compared to the conventional technology, the uniform pressing apparatus in the present invention can be directly in contact with the mold or the substrate to provide uniform imprinting pressure such that nanostructures of the mold can be uniformly pressed into the molding material layer during imprinting. Moreover, as each point in an imprint region has equal pressure, perfect parallel arrangement between the mold and the substrate can be maintained, thereby improving the nanoimprint molding quality. Additionally, the uniform pressing apparatus in the present invention can be applied to the case of using a single substrate or continuous substrates. Therefore, the present invention is suitable for large area imprinting and also continuous imprinting.

As the present invention uses a uniform pressing unit to provide uniform imprinting force during an imprinting process, the imprint molding quality is effectively improved. The present invention can utilize a simple structure to resolve a drawback of difficulty in fabrication and assembly caused by mechanical errors in the conventional technology, such that significant advantages are yielded in the present invention such as making each point in an imprint region have equal pressure, maintaining perfect parallel arrangement between the mold and substrate, and minimizing influences from surface mechanical properties of other components on the parallel arrangement, such that the present invention can perform large area imprinting and continuous imprinting, thereby having better competitiveness in the market. Therefore, the present invention can resolve various drawbacks in the conventional technology such as uneven pressure being applied, partial distortion/deformation of nanostructures, limited yields, stress concentration, and difficulty in fabrication and assembly, such that the present invention can improve industrial practicability of the apparatus.

BRIEF DESCRIPTION OF THE DRAWINGS

The present invention can be more fully understood by reading the following detailed description of the preferred embodiments, with reference made to the accompanying drawings, wherein:

FIGS. 1A to 1C show a microimprint/nanoimprint uniform pressing apparatus according to a first preferred embodiment of the present invention, wherein FIG. 1A is a schematic diagram of the uniform pressing apparatus used in an imprinting device, FIG. 1B is a schematic diagram of a uniform pressing unit connected to a driving unit and fixed in a holding unit, and FIG. 1C is a diagram showing imprinting results on a sensitive paper sheet;

FIGS. 6A and 6B (PRIOR ART) are schematic diagrams showing uneven imprinting pressure being applied by a conventional imprinting technology, wherein FIG. 6A shows partial distortion/deformation of nanostructures due to uneven imprint depths, and FIG. 6B shows slanting of nanostructures in an imprint region due to unsatisfactory parallel arrangement between a mold and a substrate;

DETAILED DESCRIPTION OF THE PREFERRED EMBODIMENTS

Figure 1A:
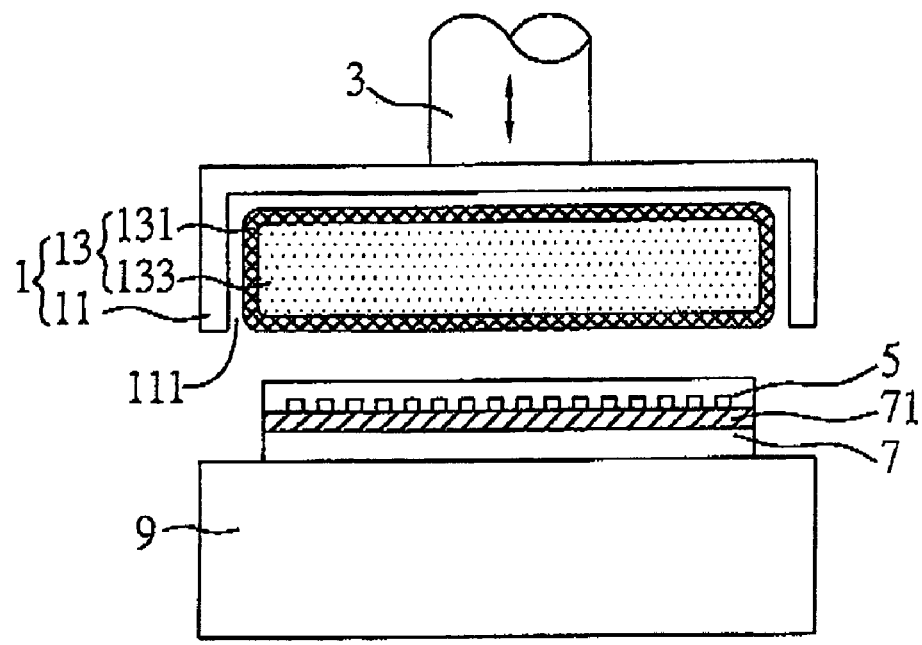

Preferred embodiments of a microimprint/nanoimprint uniform pressing apparatus proposed in the present invention are described in detail as follows with reference to FIGS. 1 to 5. It should be noted that the microimprint/nanoimprint uniform pressing apparatus in the present invention is used in a microimprinting/nanoimprinting device, for providing uniform imprinting pressure to a molding material layer between a substrate and a mold. The following embodiments exemplify microstructures having a size of below 100 micrometers and nanostructures, which are fabricated by using the microimprint/nanoimprint uniform pressing apparatus; however, the present invention is not limited to this arrangement. Since conventional nanostructures, mold, molding material layer and substrate are used in the present invention and are not modified in structure, for the sake of simplicity and clarifying the technical features and structures of the present invention, only structures directly relating to the present invention are shown in the drawings, and the other parts are omitted.

First Preferred Embodiment

Figure 1B:
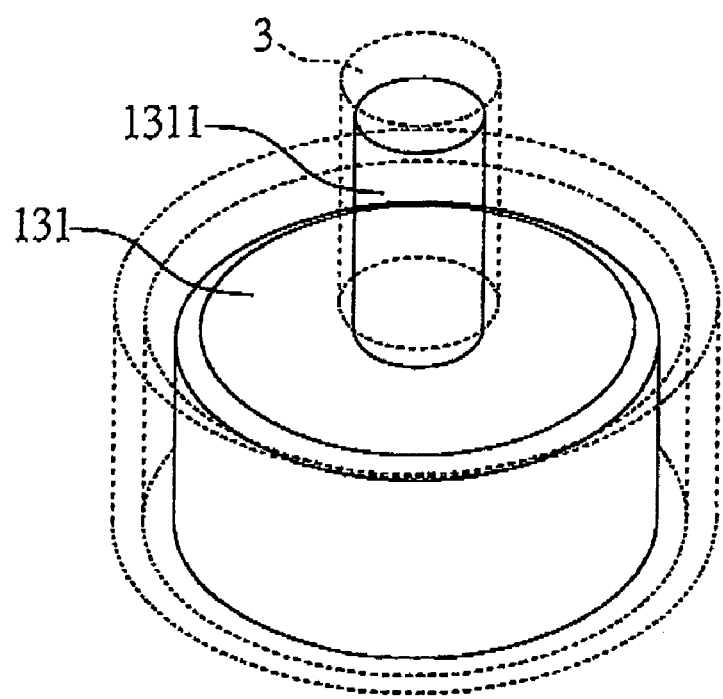
Figure 1C:
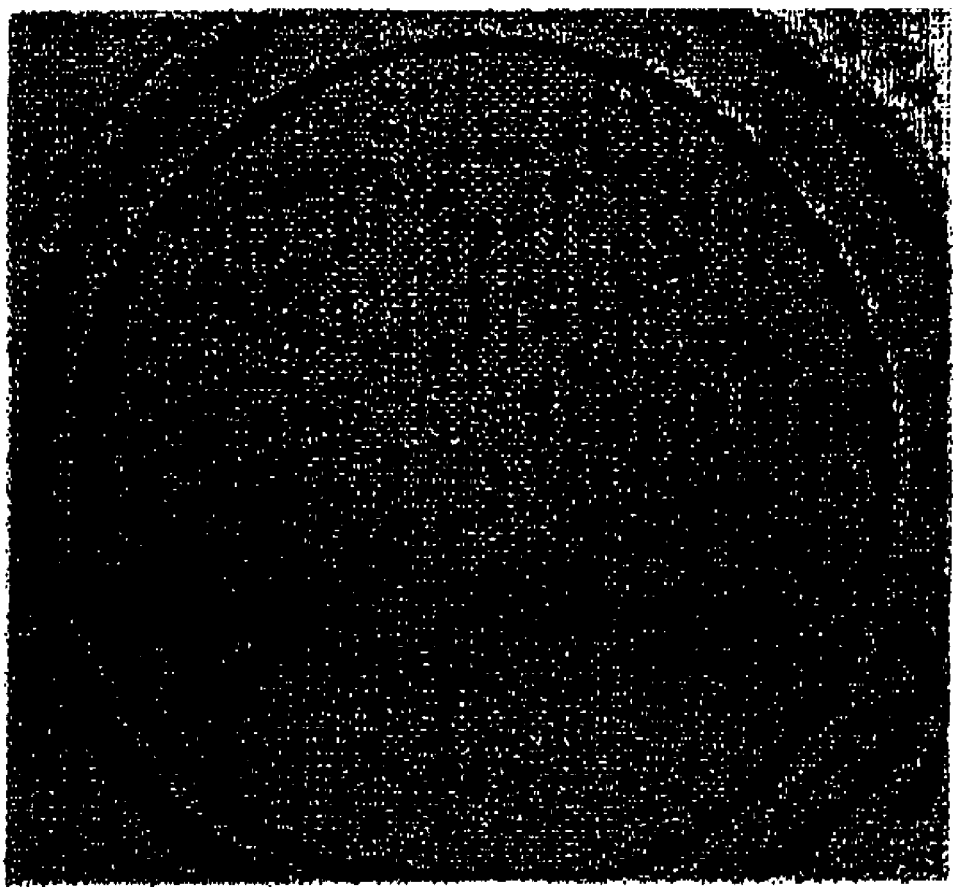

FIGS. 1A to 1C relate to the microimprint/nanoimprint uniform pressing apparatus according to a first preferred embodiment of the present invention.

Referring to FIG. 1A, the microimprint/nanoimprint uniform pressing apparatus 1 in this embodiment comprises a carrier unit 9, a holding unit 11 and a uniform pressing unit 13. The carrier unit 9 is used to provide support for performing imprint molding. The holding unit 11 can be disposed above or below a mold and is adjacent to the uniform pressing unit 13. The holding unit 11 is formed with an opening at one end thereof and an accommodating space 111 for receiving the uniform pressing unit 13 therein. The uniform pressing unit 13 includes a flexible membrane 131 and a fluid 133 filled in a space formed by the flexible membrane 131. The flexible membrane 131 is made of a sealed material capable of sustaining high pressure. The fluid 133 comprises a liquid, gas or equivalent substance having each point with equal pressure. The fluid 133 may provide uniform force transmission by the Pascal's Principle to achieve uniform pressure application. The Pascal's Principle is known in the art and is not further to be described herein.

Referring to FIG. 1B, a joint portion 1311 can be formed on an outer surface of the flexible membrane 131 and penetrates the holding unit 11 to be connected to a driving unit 3, such that the uniform pressing unit 13 is fixed in the holding unit 11 by means of the joint portion 1311 serving as a contact structure. Alternatively, the joint portion 1311, instead of the contact structure, can be an attachment structure such as an adhesive layer, which is attached to a bottom side of the opening of the holding unit 11 to fix the uniform pressing unit 13 in the holding unit 11. In other words, a structure for fixing the uniform pressing unit 13 in the holding unit 11 is not limited to that described in this embodiment but can be flexibly modified.

In this embodiment, an imprint mold 5 is mounted on a substrate 7. Similarly to the conventional technology, a molding material layer 71 made of such as a polymer is applied on a surface of the substrate 7 in contact with the mold 5, and the substrate 7 can be carried by the carrier unit 9 serving as a power transfer module. The carrier unit 9 serving as the power transfer module can selectively comprise two power sources (not shown), including for example an ultraviolet source and a heating source, which are used according to requirements. It should be noted that, the carrier unit 9 serving as the power transfer module is preferably used for carrying the substrate 7 in this embodiment but the present invention is not limited to this arrangement; any other carrier unit having suitable functions is also applicable for carrying the substrate 7.

It is different from the conventional technology in that there is no need to provide any other carrier unit under the uniform pressing unit 13, such that the uniform pressing unit 13 can be directly in contact with the mold 5. When the driving unit 3 is driven by a power source (not shown) to move downwardly, the holding unit 11 and the uniform pressing unit 13 are also moved downwardly until the mold 5 is completely in contact with the molding material layer 71 and establishes appropriate pressure, such that the uniform pressing unit 13 received in the holding unit 11 can directly apply pressure to the mold 5.

Figure 7A:
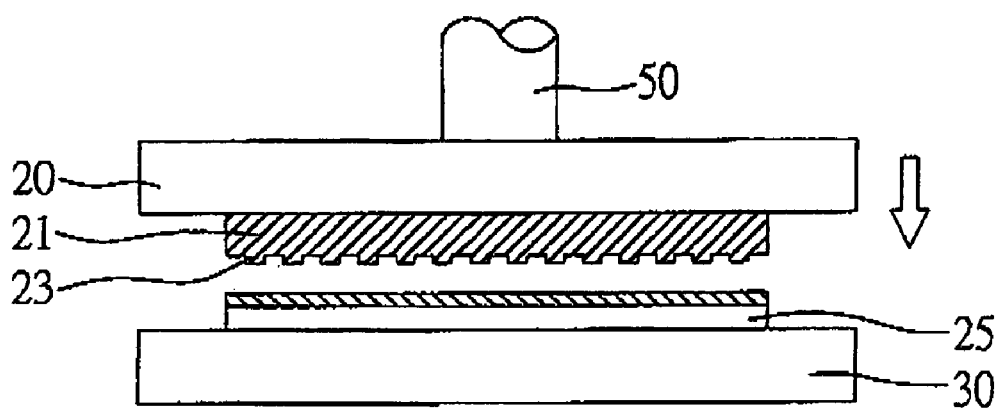
FIG. 7A (PRIOR ART) is a schematic diagram of another conventional pressing structure.
Figure 7B:
FIG. 7B (PRIOR ART) is a diagram showing conventional imprinting results on a sensitive paper sheet.
Figure 8:
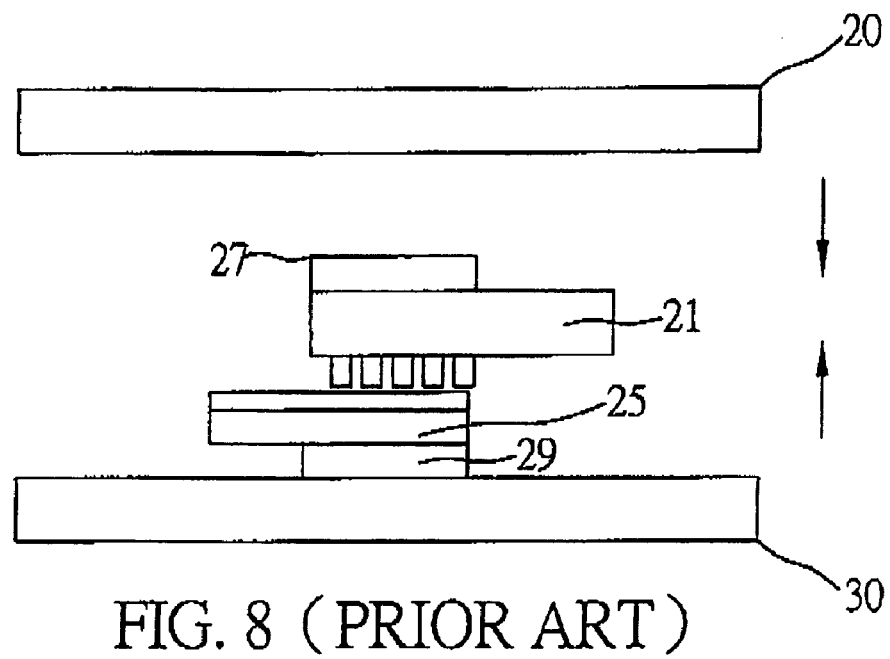
FIG. 8 (PRIOR ART) is a schematic diagram of a uniform pressing apparatus disclosed in a reference by Puscasu et al.
Figure 9:
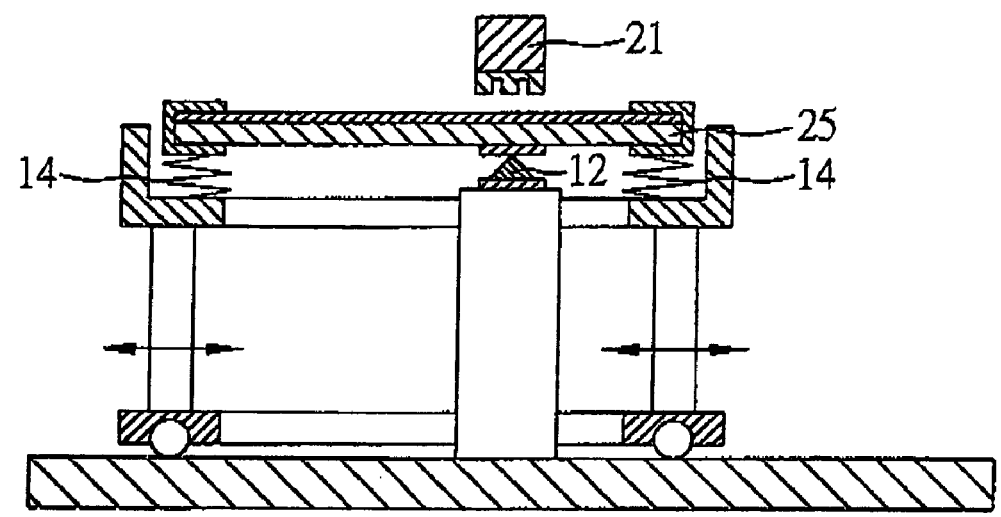
FIG. 9 (PRIOR ART) is a schematic diagram of an imprint molding displacement mechanism disclosed in JP 2003-077867.
Figure 10:
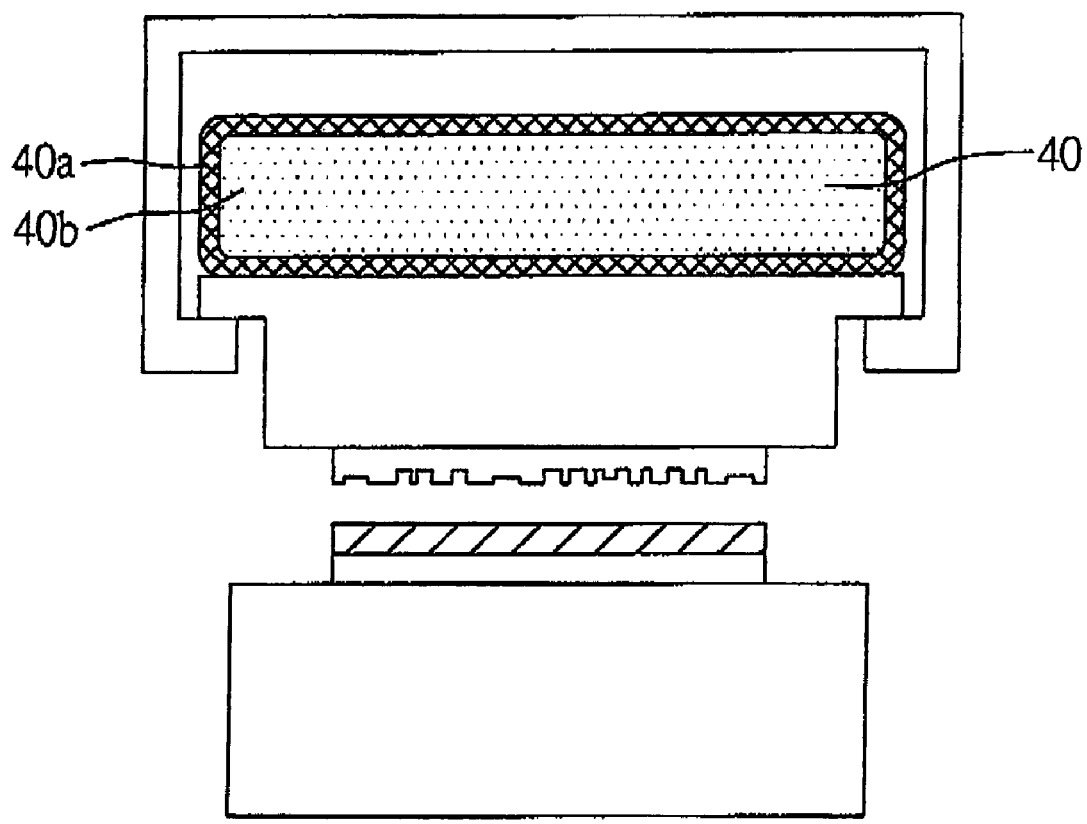
FIG. 10 (PRIOR ART) is a schematic diagram of a nanoimprint uniform pressing apparatus disclosed in U.S. Patent Publication No. 20040219249 A1.

Referring to FIG. 1C, a sensitive paper sheet subjected to imprinting by the uniform pressing apparatus 1 clearly shows quite uniform coloring of the entire imprint region as compared to the conventional technology (as shown in FIG. 7B). Therefore, the present invention can effectively improve uniformity of applying pressure by the apparatus.

As the uniform pressing apparatus 1 in the present invention does not have a limitation of necessarily considering mechanical errors as in the conventional technology, and can directly transfer imprinting pressure in a molding region, the present invention may utilize a simple structure to provide uniform force transmission to allow the imprinting pressure to be uniformly applied to the mold 5. As a result, a drawback of force transmission being affected by surface mechanical properties of components due to a pressing unit being provided in an imprinting pressure transmission path in the conventional technology is avoided. Therefore, the present invention can provide uniform imprinting pressure.

It should be understood that, the present invention can use and adjust high pressure and/or normal pressure being applied as a power source to perform uniform imprinting. For example, after appropriate pressure is produced between the mold 5 and the molding material layer 71 during an ultraviolet curing molding process, further movement is instantly stopped to maintain a pressure-applying stage. For example, during a hot pressing molding process, similarly after appropriate pressure is produced between the mold 5 and the molding material layer 71 (usually larger than the pressure in the ultraviolet curing molding process), further movement can be instantly stopped to maintain a pressure-applying stage. In other words, the uniform pressing apparatus in the present invention is suitably applied to, but not limited to, conditions with normal temperature and normal pressure for the ultraviolet curing molding process or conditions with high temperature and high pressure for the hot pressing molding process. The above processes are conventional and not technical features of the present invention, thereby not to be further described herein. Moreover, a fixing structure (i.e. the joint portion 1311) between the holding unit 11 and the uniform pressing unit 13 may also be for example a metallic fastener, not limited to the contact structure or the adhesive layer described in this embodiment.

Compared to the conventional technology, various drawbacks such as uneven pressure being applied, partial distortion/deformation of nanostructures, limited yields, stress concentration, mechanical errors, difficulty in fabrication, requirement of high assembly precision, complicated apparatus structure and high fabrication costs in the conventional technology can be resolved by the present invention using the uniform pressing unit to directly transmit imprinting pressure to the mold such that a simple structure can be utilized to provide transmission of uniform imprinting pressure.

As the uniform pressing apparatus in the present invention employs the uniform pressing unit to directly transfer the imprinting pressure to the mold, such that the number of conventional components such as housing, heating/cooling unit and carrier unit required for transmitting force to a molding region can be minimized in the present invention. Accordingly, the uniform pressing apparatus in the present invention not only eliminates difficulty in fabrication and assembly but also simplifies the structure and reduces the costs thereof.

The present invention is not limited to an application of small area imprinting, and does not have drawbacks such as substrate deformation during large area imprinting and structural damage caused by stress concentration at a fulcrum under excessive imprinting force. The present invention therefore provides a microimprint/nanoimprint uniform pressing apparatus capable of accomplishing large area imprinting in one time, thereby favorable for mass production.

Since the uniform pressing apparatus in the present invention is applicable to different imprint molding processes, the present invention can use a simple structure and is suitable for different imprint molding processes, thereby improving the industrial practicability.

Therefore, in the use of the present invention, a simple structure can be used to transmit uniform imprinting pressure, and various problems caused by the conventional technology can be solved, such that advantages such as reduction in apparatus costs, increase in yields and improvement in industrial practicability of the apparatus are achieved by the present invention.

Second Preferred Embodiment

Figure 2:
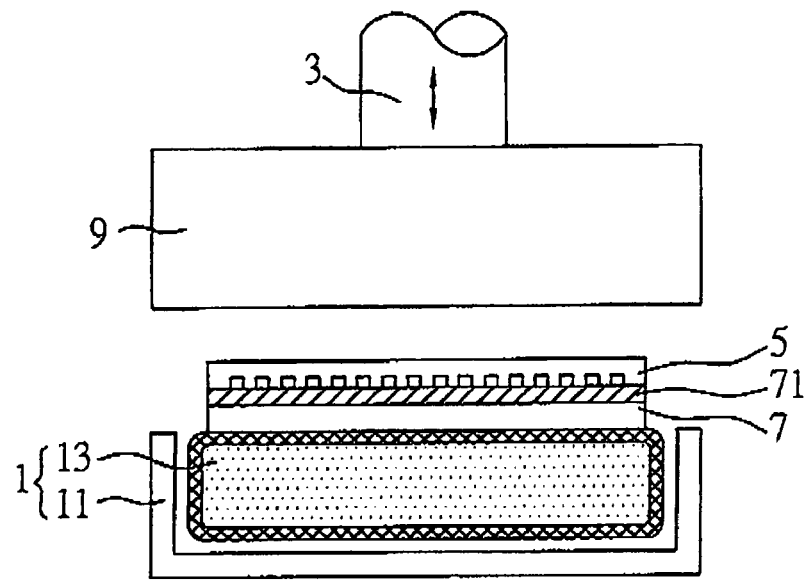
FIG. 2 is a schematic diagram of the microimprint/nanoimprint uniform pressing apparatus according to a second preferred embodiment of the present invention.

FIG. 2 is a schematic diagram of the microimprint/nanoimprint uniform pressing apparatus 1 according to a second preferred embodiment of the present invention, wherein same or similar elements as or to those in the first embodiment are designated with same or similar reference numerals and detailed descriptions thereof are omitted for the sake of clarify.

The second embodiment differs from the first embodiment in that, instead of mounting the uniform pressing apparatus 1 below the driving unit 3 to have the uniform pressing unit 13 directly in contact with the mold 5 in the first embodiment, the uniform pressing apparatus 1 is provided under the substrate 7 in the second embodiment, wherein the carrier unit 9 is located above the mold 5 and the uniform pressing unit 13 is directly in contact with the substrate 7.

Referring to FIG. 2, the uniform pressing unit 13 of the uniform pressing apparatus 1 in this embodiment is received in the holding unit 11 and used for carrying the substrate 7 coated with the molding material layer 71 thereon and the mold 5. The driving unit 3 is connected to the carrier unit 9 and drives the carrier unit 9 to move downwardly until the mold 5 is completely in contact with the molding material layer 71 and establishes appropriate pressure, so as to provide uniform imprinting pressure during an imprinting process.

The first embodiment uses the carrier unit 9 to carry the substrate 7. However in the second embodiment, the uniform pressing apparatus 1 can be utilized to carry the substrate 7, and the carrier unit 9 connected to the driving unit 3 can be a carrier element such as a carrier plate, such that the uniform imprinting quality shown in FIG. 1C can be similarly obtained without necessarily limiting a location of for example a power transfer module.

It should be noted that, the locations of the mold 5 and the substrate 7 may also be exchanged, as long as the imprinting pressure can be transferred to the molding material layer 71 to perform imprinting on the molding material layer 71. This arrangement and similar modifications are all applicable in the present invention and can be easily anticipated by a person skilled in the art.

Therefore, the uniform pressing apparatus 1 in the present invention can allow the uniform pressing unit 13 to be directly in contact with the mold 5 or the substrate 7 to uniformly transmit the imprinting pressure and maintain satisfactory parallel arrangement between the mold 5 and the substrate 7 during imprinting, thereby effectively improving the nanoimprint molding quality.

Third Preferred Embodiment

Figure 3:
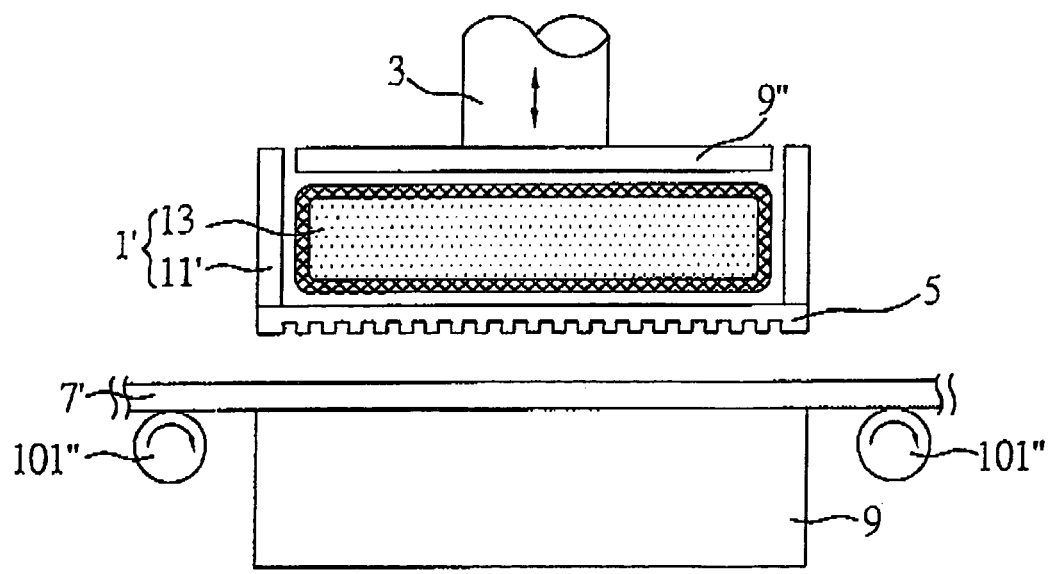
FIG. 3 is a schematic diagram of the microimprint/nanoimprint uniform pressing apparatus according to a third preferred embodiment of the present invention.

FIG. 3 is a schematic diagram of the microimprint/nanoimprint uniform pressing apparatus 1' according to a third preferred embodiment of the present invention, wherein same or similar elements as or to those in the foregoing embodiments are designated with same or similar reference numerals and detailed descriptions thereof are omitted.

The third embodiment differs from the foregoing embodiments in that the mold 5 is mounted to the holding unit 11' of the uniform pressing apparatus 1'.

Referring to FIG. 3, the holding unit 11' is formed with openings at both ends thereof. In this embodiment, the uniform pressing unit 13 is received in the holding unit 11' and connected to a pressing plate 9" mounted at one end of the holding unit 11'. The pressing plate 9" is connected to the driving unit 3. The mold 5 is mounted via a side thereof to the opening at the end of the holding unit 11' relatively farther from the pressing plate 9'''. Continuous substrates 7' such as a strip of substrates are carried by the carrier unit 9, wherein two transmission units 101'' such as conveyer belts or rollers are provided at two sides of the carrier unit 9, for transmitting and driving the substrates 7' to be subjected to a continuous imprint molding process.

In this case, when the driving unit 3 is driven by a power source to move downwardly, the pressing plate 9''', the uniform pressing unit 13, the holding unit 11' and the mold 5 are moved downwardly until the mold 5 is completely in contact with the substrates 7' and establishes appropriate pressure, such that the uniform pressing unit 13 can directly apply pressure to the mold 5 to provide uniform imprinting pressure. After the imprinting process is complete, the transmission units 101'' can drive the substrates 7' to undergo the next stage of imprinting process.

Moreover, the carrier unit 9 can be a power transfer unit comprising for example two power sources, to transfer power to the molding material layer to perform imprint molding on the molding material layer. This arrangement is easily anticipated by the person skilled in the art.

Fourth Preferred Embodiment

Figure 4:
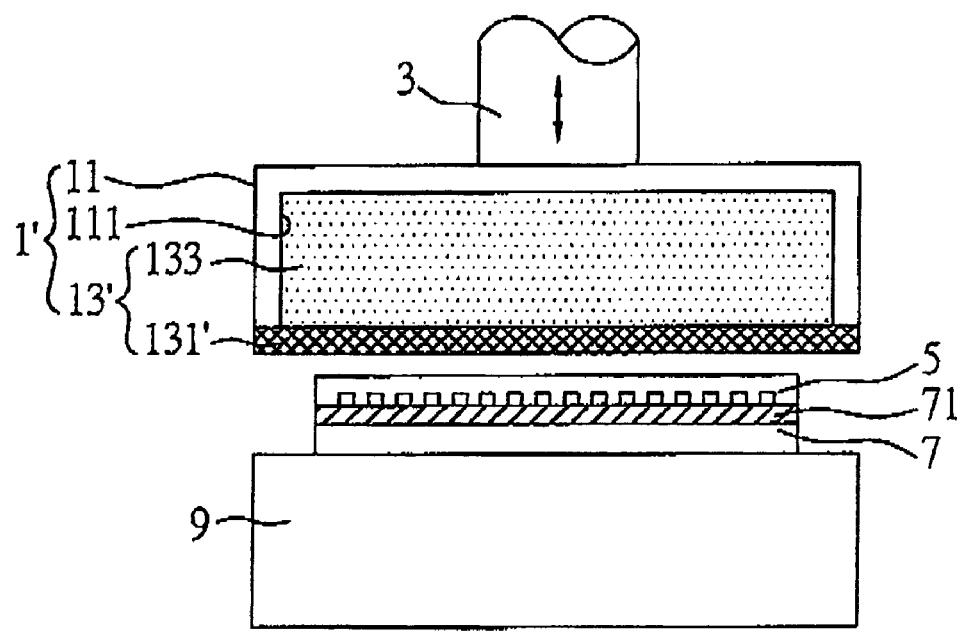
FIG. 4 is a schematic diagram of the microimprint/nanoimprint uniform pressing apparatus according to a fourth preferred embodiment of the present invention.

FIG. 4 is a schematic diagram of the microimprint/nanoimprint uniform pressing apparatus 1' according to a fourth preferred embodiment of the present invention, wherein same or similar elements as or to those in the foregoing embodiments are designated with same or similar reference numerals and detailed descriptions thereof are omitted.

The fourth embodiment differs from the foregoing embodiments in that, the fluid 133 of the uniform pressing unit 13' is filled in the accommodating space 111 of the holding unit 11, and the flexible membrane 131' of the uniform pressing unit 13' is provided at an opening of the holding unit 11 to seal the accommodating space 111 filled with the fluid 133.

Referring to FIG. 4, similarly to the first embodiment, the holding unit 11 is formed an opening at one end thereof and the accommodating space 111. However, the fourth embodiment differs from the first embodiment in that, the uniform pressing unit 13' includes the flexible membrane 131' for sealing the opening and the fluid 133 filled in the accommodating space 111. The holding unit 11 also functions as the pressing plate 9''' in the third embodiment, and can be connected to the driving unit 3 and maintain the uniform pressing unit 13'. It should be noted that, the flexible membrane 131' is selectively made of a sealed material capable of sustaining high pressure, and the fluid 133 can comprise a liquid, gas or equivalent substance having each point with equal pressure.

When the driving unit 3 is driven by a power source to move downwardly, the uniform pressing apparatus 1' is also moved downwardly until the mold 5 is completely in contact with the molding material layer 71 and establishes appropriate pressure. In the meantime, the flexible membrane 131' can directly apply pressure to the mold 5.

Moreover, similarly to the first embodiment, the carrier unit 9 can be used to carry the substrate 7, wherein the carrier unit 9 may serve as a power transfer module as in the first embodiment or may be a normal carrier element.

Fifth Preferred Embodiment

Figure 5:
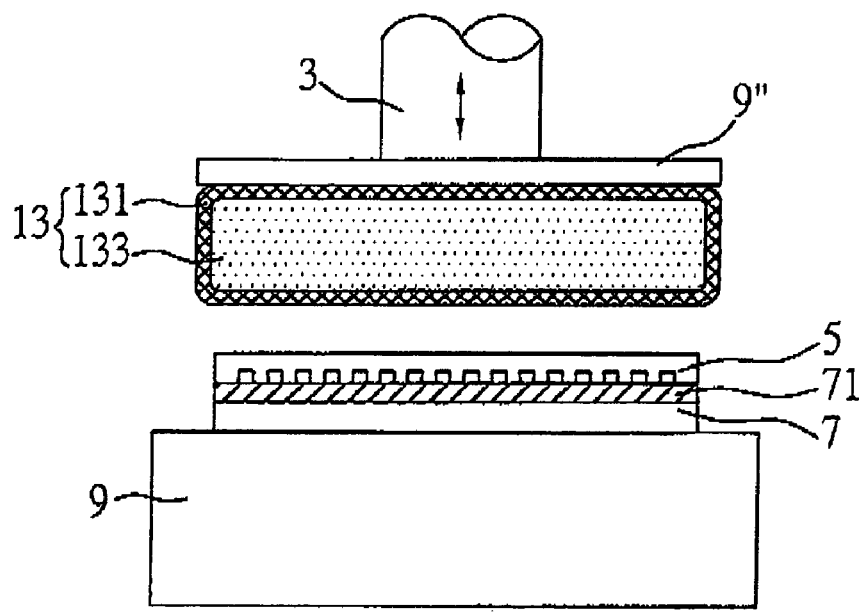
FIG. 5 is a schematic diagram of the microimprint/nanoimprint uniform pressing apparatus according to a fifth preferred embodiment of the present invention.
Figure 6A:
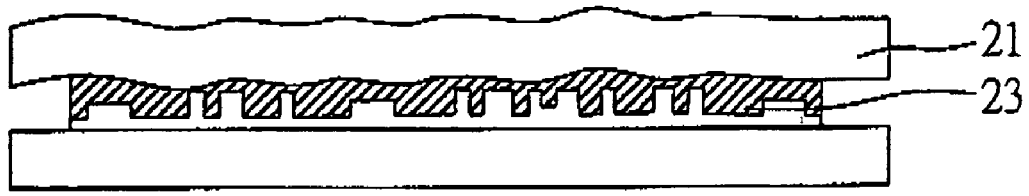
Figure 6B:
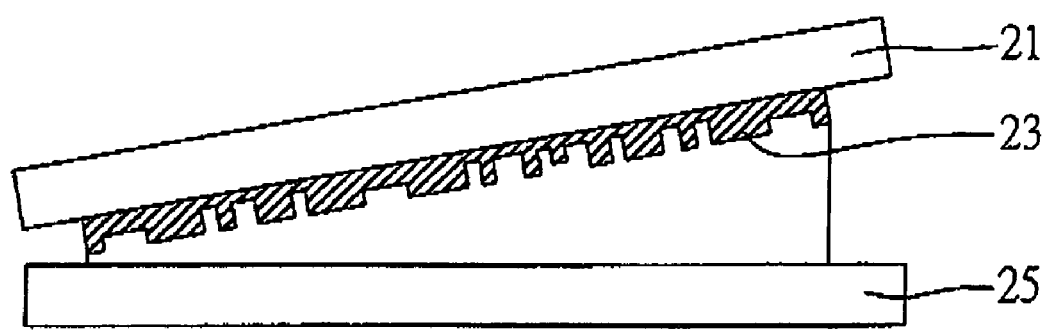

FIG. 5 is a schematic diagram of the microimprint/nanoimprint uniform pressing apparatus according to a fifth preferred embodiment of the present invention, wherein same or similar elements as or to those in the foregoing embodiments are designated with same or similar reference numerals and detailed descriptions thereof are omitted.

The fifth embodiment differs from the foregoing embodiments in that, the holding unit having the accommodating space is not required, and the uniform pressing unit 13 is directly mounted to the pressing plate 9''' connected to the driving unit 3.

Referring to FIG. 5, similarly to the first, second and third embodiments, the uniform pressing unit 13 includes the flexible membrane 131 and the fluid 133 filled in a space formed by the flexible membrane 131. However, in the fifth embodiment, the uniform pressing unit 13 is mounted to the pressing plate 9''' that is connected to the driving unit 3. Similarly to the foregoing embodiments, a joint portion can be formed between the pressing plate 9''' and the uniform pressing unit 13, and the joint portion may be a contact structure, an attachment structure, a metallic fastener or an equivalent fixing structure.

It should be noted that, similarly to the first and fourth embodiments, the carrier unit 9 can be used to carry the substrate 7, wherein the carrier unit 9 may serve as a power transfer module as in the first embodiment or a normal carrier plate as in the second embodiment. Further, for example, the locations of the mold 5 and the substrate 7 can be exchanged in the fifth embodiment. In other words, various elements in the foregoing embodiments can be modified or replaced according to practical requirements but not limited to those described in the embodiments.

As the location of the uniform pressing unit 13 can be maintained without deviating from a driving force transmission path by means of the pressing plate 9''', when the driving unit 3 is driven by a power source to move downwardly, the pressing plate 9''' and the uniform pressing unit 13 are also moved downwardly until the mold 5 is completely in contact with the molding material layer 71 and establishes appropriate pressure. As a result, the uniform pressing unit 13 can directly apply pressure to the mold 5.

Therefore, compared to the conventional technology in which a combination of components such as housing, heating/cooling unit and carrier unit is required to transmit force to a molding region, the microimprint/nanoimprint uniform pressing apparatus in the present invention can minimize the number of required components and utilize a simple structure to transfer uniform imprinting pressure, thereby further reducing the apparatus costs.

Moreover, the uniform pressing apparatus in the present invention is suitably applied to the case of using a single substrate in the first and second embodiment or the case of using continuous substrates in the third embodiment, such that the present invention can be used to perform large area imprinting and also continuous imprinting. Thus, the present invention can achieve large area imprinting in one time, thereby improving the yields.

The present invention is also suitably applied to the conditions required for an ultraviolet curing molding process or a hot pressing molding process. Besides, the location of the microimprint/nanoimprint uniform pressing apparatus in the present invention can be adjusted in accordance with the structure of an imprinting device, and locations of the substrate and the mold may flexibly be exchanged without any difficulty. As such, a user can apply the present invention according to practical requirements, making the microimprint/nanoimprint uniform pressing apparatus in the present invention more flexible than the conventional technology and have better competitiveness in the market.

Therefore, the present invention provides a microimprint/nanoimprint uniform pressing apparatus for directly applying

What is claimed is:

1. A microimprint/nanoimprint uniform pressing apparatus for providing uniform imprinting pressure to a molding material layer formed between a substrate and a mold, the microimprint/nanoimprint uniform pressing apparatus comprising:
a holding unit formed with an opening at one end thereof and an accommodating space therein;
a driving unit connected to the holding unit;
a uniform pressing unit being directly in contact with the substrate or the mold and comprising a fluid and a bag-shaped flexible membrane;
a carrier unit for providing support for performing imprint molding; and
two transmission units provided at two sides of the carrier unit respectively, for transmitting the substrate in the form of a continuous strip,
wherein the fluid fills in the accommodating space and the opening is sealed by the flexible membrane such that the fluid is enclosed by the holding unit and the flexible membrane.

2. The microimprint/nanoimprint uniform pressing apparatus of claim 1, wherein the holding unit is located above or below the mold.

3. The microimprint/nanoimprint uniform pressing apparatus of claim 1, wherein the bag-shaped flexible membrane is made of a sealed material capable of sustaining high pressure.

4. The microimprint/nanoimprint uniform pressing apparatus of claim 1, wherein a joint portion is formed on an outer surface of the bag-shaped flexible membrane.

5. The microimprint/nanoimprint uniform pressing apparatus of claim 4, wherein the joint portion is one selected from the group consisting of a contact structure, an attachment structure and a metallic fastener.

6. The microimprint/nanoimprint uniform pressing apparatus of claim 1, wherein the carrier unit is for carrying the substrate.

7. The microimprint/nanoimprint uniform pressing apparatus of claim 1, wherein at least one of the transmission unit is a conveyer belt or roller.

8. The microimprint/nanoimprint uniform pressing apparatus of claim 1, wherein the carrier unit comprises a power transfer unit having at least one power source therein, to transfer power to the molding material layer for performing the imprint molding on the molding material layer.

9. A microimprint/nanoimprint uniform pressing apparatus mounted to a holding unit connected to a driving unit, so as to provide uniform imprinting pressure to a molding material layer between a substrate and a mold, the microimprint/nanoimprint uniform pressing apparatus comprising:
a bag-shaped flexible membrane connected to the holding unit, for being directly in contact with the mold or the substrate;
a fluid enclosed by the holding unit and the flexible membrane;
a carrier unit for providing support for performing imprint molding; and
two transmission units provided at two sides of the carrier unit respectively, for transmitting the substrate in the form of a continuous strip.

10. The microimprint/nanoimprint uniform pressing apparatus of claim 9, wherein the bag-shaped flexible membrane is made of a sealed material capable of sustaining high pressure.

11. The microimprint/nanoimprint uniform pressing apparatus of claim 9, wherein a joint portion is formed on an outer surface of the bag-shaped flexible membrane.

12. The microimprint/nanoimprint uniform pressing apparatus of claim 11, wherein the joint portion is one selected from the group consisting of a contact structure, an attachment structure and a metallic fastener.

13. The microimprint/nanoimprint uniform pressing apparatus of claim 9, wherein the carrier unit is for carrying the substrate.

14. The microimprint/nanoimprint uniform pressing apparatus of claim 13, wherein the carrier unit comprises a power transfer unit having at least one power source therein, to transfer power to the molding material layer for performing the imprint molding on the molding material layer.

* * * * *